United States Patent
Verma et al.

(10) Patent No.: US 7,305,604 B1
(45) Date of Patent: Dec. 4, 2007

(54) DETERMINING EDGE RELATIONSHIP BETWEEN CLOCK SIGNALS

(75) Inventors: Himanshu J. Verma, Mountain View, CA (US); Ajay Dalvi, San Francisco, CA (US); Paul A. Swartz, Hillsborough, CA (US)

(73) Assignee: Xilinx, Inc., San Jose, CA (US)

( * ) Notice: Subject to any disclaimer, the term of this patent is extended or adjusted under 35 U.S.C. 154(b) by 333 days.

(21) Appl. No.: 11/072,871

(22) Filed: Mar. 4, 2005

(51) Int. Cl.
*G01R 31/28* (2006.01)
(52) U.S. Cl. .................................................. 714/744
(58) Field of Classification Search ................ 714/725, 714/731, 744
See application file for complete search history.

(56) References Cited

U.S. PATENT DOCUMENTS

| | | | |
|---|---|---|---|
| 5,914,616 A | 6/1999 | Young et al. | |
| 6,437,597 B1 | 8/2002 | Chan | |
| 6,594,797 B1 | 7/2003 | Dudley et al. | |
| 6,816,991 B2 * | 11/2004 | Sanghani | 714/733 |
| 7,152,176 B2 * | 12/2006 | Neuman | 713/401 |

OTHER PUBLICATIONS

Xilinx, Inc.; "Virtex-II Pro Platform FPGA Handbook"; published Oct. 14, 2002; pp. 19-71, available from Xilinx, Inc., 2100 Logic Drive, San Jose, California 95124.
Xilinx, Inc.; "Virtex-II Platform FPGA Handbook"; published Dec. 2000; pp. 33-75, available from Xilinx, Inc., 2100 Logic Drive, San Jose, California 95124.
Xilinx, Inc.; "The Programmable Logic Data Book"; published Apr. 2000; pp. 3-75 to 3-96, available from Xilinx, Inc., 2100 Logic Drive, San Jose, California 95124.

* cited by examiner

*Primary Examiner*—James C. Kerveros
(74) *Attorney, Agent, or Firm*—W. Eric Webostad

(57) ABSTRACT

First and second clock signals are provided to first and second sequential circuits, where the first and second clock signals are inversely coupled to logic high and low levels for clocking of the first and second sequential circuits. A third sequential circuit is clocked responsive to a first output from the first sequential circuit and receives first signature data. A fourth sequential circuit is clocked responsive to a second output from the second sequential circuit and receives second signature data. A third output from the third sequential circuit is monitored responsive to the first signature data and the first output. A fourth output from the fourth sequential circuit is monitored responsive to the second signature data and the second output. Whether the first clock signal and the second clock signal are phase aligned may be determined responsive to the third output and the fourth output.

20 Claims, 4 Drawing Sheets

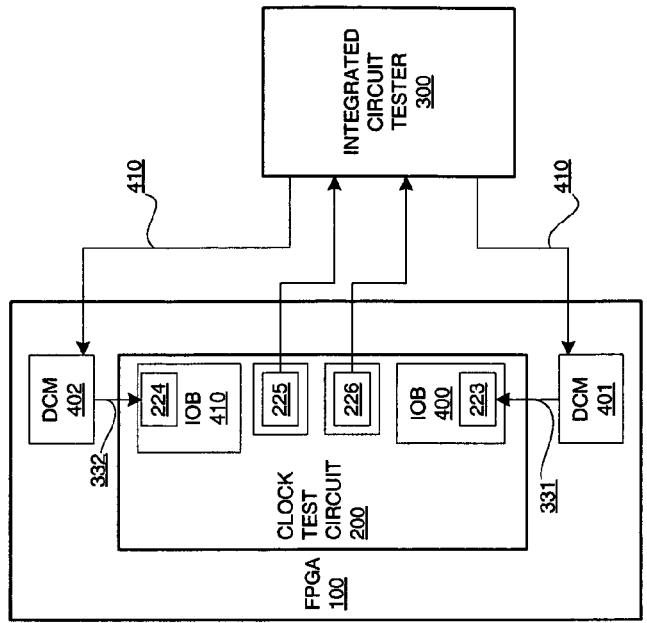
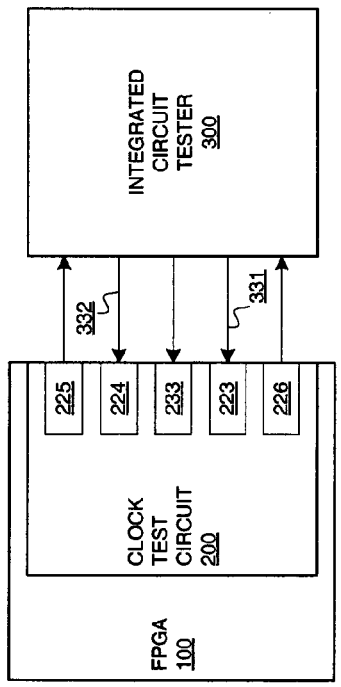
FIG. 3
FIG. 4

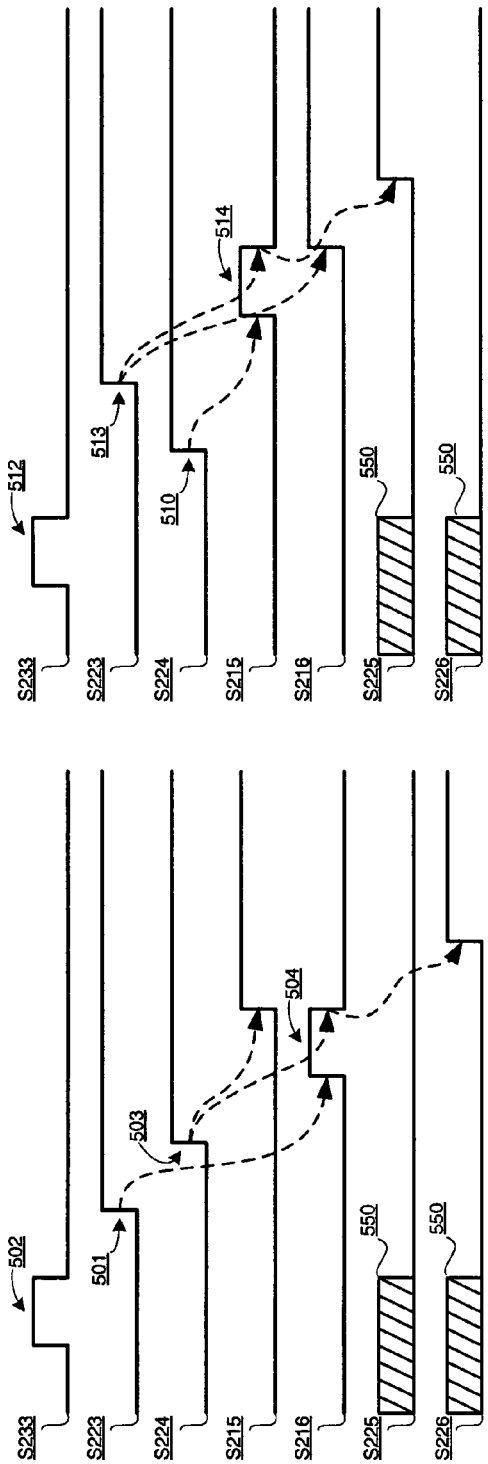
FIG. 5B
FIG. 5A
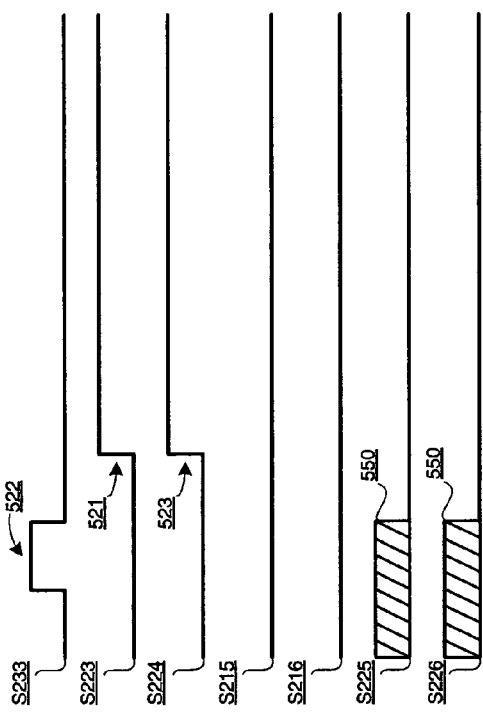
FIG. 5C

DETERMINING EDGE RELATIONSHIP BETWEEN CLOCK SIGNALS

FIELD OF THE INVENTION

One or more aspects of the invention relate generally to determining relationship of signal edges and, more particularly, determining coincidence of clock signal edges.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean comprising without limitation.

One such FPGA, the Xilinx Virtex® FPGA, is described in detail in pages 3-75 through 3-96 of the Xilinx 2000 Data Book entitled "The Programmable Logic Data Book 2000" (hereinafter referred to as "the Xilinx Data Book"), published April, 2000, available from Xilinx, Inc., 2100 Logic Drive, San Jose, Calif. 95124. (Xilinx, Inc., owner of the copyright, has no objection to copying these and other pages referenced herein but otherwise reserves all copyright rights whatsoever.) Young et al. further describe the interconnect structure of the Virtex FPGA in U.S. Pat. No. 5,914,616, issued Jun. 22, 1999 and entitled "FPGA Repeatable Interconnect Structure with Hierarchical Interconnect Lines".

Another such FPGA, the Xilinx Virtex®-II FPGA, is described in detail in pages 33-75 of the "Virtex-II Platform FPGA Handbook", published December, 2000, available from Xilinx, Inc., 2100 Logic Drive, San Jose, Calif. 95124. And yet another such FPGA, the Xilinx Virtex-II Pro™ FPGA, is described in detail in pages 19-71 of the "Virtex-II Pro Platform FPGA Handbook", published Oct. 14, 2002 and available from Xilinx, Inc., 2100 Logic Drive, San Jose, Calif. 95124.

Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Heretofore, performance of a design instantiated in programmably configurable circuitry of an FPGA having clock signals provided to different IOBs meant laborious placement and routing of logic blocks and clock networks to generally ensure zero skew between such spatially distant IOBs of the FPGA.

Accordingly, it would be desirable and useful to provide means to provide accurate alignment of clock signals with less placement and routing dependency to generally ensure zero skew than in the past.

SUMMARY OF THE INVENTION

One or more aspects of the invention generally relate to determining relationship of signal edges and, more particularly, determining coincidence of clock signal edges.

An aspect of the invention is a clock test circuit in an integrated circuit. A first clock network is coupled to receive a first clock signal and a second clock network is coupled to receive a second clock signal. A first double-data rate flip-flop has first data ports, first clock ports, a first reset port, and a first output port. The first double-data rate flip-flop is coupled to receive the first clock signal from the first clock network to one of the first clock ports and coupled to receive the second clock signal from the second clock network to another one of the first clock ports. One of the first clock ports is associated with a logic low input to one of the first data ports and the other of the first clock ports is associated with a logic high input to another one of the first data ports. A second double-data rate flip-flop has second data ports, second clock ports, a second reset port, and a second output port. The second double-data rate flip-flop is coupled to receive the first clock signal from the first clock network to one of the second clock ports and coupled to receive the second clock signal from the second clock network to another one of the second clock ports. One of the second clock ports is associated with a logic high input to one of the second data ports and the other of the second clock ports associated with a logic low input to another one of the second data ports. A first flip-flop is coupled to receive a first output from the first double-data rate flip-flop. A second flip-flop is coupled to receive a second output from the second double-data rate flip-flop.

Another aspect of the invention is a system for testing for coincidence of clock signals. The system comprises an integrated circuit coupled to an integrated circuit tester. The integrated circuit includes a clock test circuit as described above in the immediately preceding paragraph.

Yet another aspect of the invention is a method for testing clock signals. A first clock signal and a second clock signal are provided to an integrated circuit. A first sequential circuit is clocked responsive to the first clock signal and the second clock signal. The first clock signal is for clocking logic high data input to the first sequential circuit. The second clock signal is for clocking logic low data input to the first sequential circuit. A second sequential circuit is clocked responsive to the first clock signal and the second clock signal. The second clock signal is for clocking logic high data input to the second sequential circuit. The first clock signal is for clocking logic low data input to the second sequential circuit. A third sequential circuit is clocked responsive to a first output from the first sequential circuit. A fourth sequential circuit is clocked responsive to a second output from the second sequential circuit. First signature data is provided to the third sequential circuit. Second signature data is provided to the fourth sequential circuit. A third output from the third sequential circuit is monitored responsive to the first signature data and the first output. A fourth output from the fourth sequential circuit is monitored responsive to the second signature data and the second output. Whether the first clock signal and the second clock signal are phase aligned may be determined responsive to the third output and the fourth output.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 3 is a high-level block diagram depicting an exemplary embodiment of an integrated circuit tester coupled to the FPGA of FIG. 1.

FIG. 4 is a high-level block diagram depicting an exemplary embodiment of an FPGA having digital clock managers for clocking input/output blocks of the FPGA.

FIGS. 5A, 5B, and 5C are timing diagrams depicting respective exemplary timing embodiments of the clock test circuit of FIG. 2.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
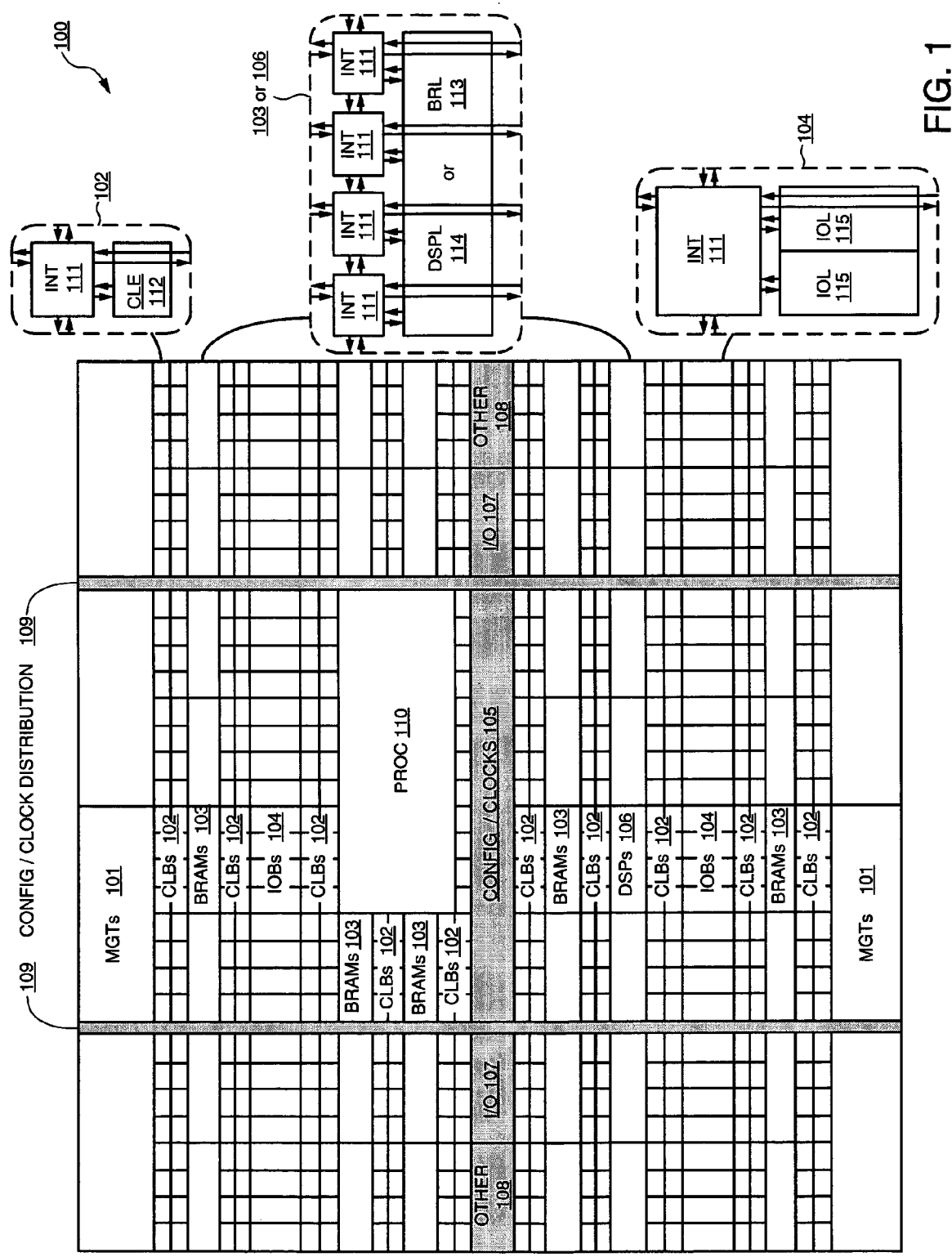
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110. FPGA 100 may be used to implement system 100 of FIG. 1.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. Additional details regarding a columnar architected FPGA may be found in a co-pending patent application, namely, U.S. patent application Ser. No. 10/683,944 entitled, "Columnar Architecture" by Steve P. Young, filed Oct. 10, 2003.

FPGA 100 illustratively represents a columnar architecture, though FPGAs of other architectures, such as ring architectures for example, may be used. FPGA 100 may be a Virtex-4™ FPGA from Xilinx of San Jose, Calif. The Xilinx Virtex-4™ FPGA is described in detail in each of the following publications: "Virtex-4 User Guide" version 1.1 [online], Xilinx Inc., 2004, [retrieved on 2004-12-16], retrieved from the Internet <http://direct.xilinx.com/bvdocs/userguides/ug070.pdf>; "Virtex-4 Packaging and Pinout Specification" publication UG075 (v2.0) [online], Xilinx Inc., 2004, [retrieved on 2004-12-16], retrieved from the Internet <http://direct.xilinx.com/bvdocs/userguides/ug075.pdf>; "Virtex-4 Data Sheet: DC and Switching Characteristics" publication DS302 (v1.1) [online], Xilinx Inc., 2004, [retrieved on 2004-12-16], retrieved from the Internet <http://direct.xilinx.com/bvdocs/publications/ds302.pdf>; and "Virtex-4 Family Overview" publication DS112 (v1.2) [online], Xilinx Inc., 2004, [retrieved on 2004-12-16], retrieved from the Internet <http://direct.xilinx.com/bvdocs/publications/ds112.pdf>. FPGA 100 may have an embedded processor, which in the Virtex-4 FPGA is an embedded PowerPC™ 405 Core. PowerPC™ 405 Core is described in detail in each of the following publications: "PowerPC™ 405 Processor Block Reference Guide" publication UG018

(v2.0) [online], Xilinx Inc., 2004, [retrieved on 2004-12-16], retrieved from the Internet <http://direct.xilinx.com/bvdocs/userguides/ug018.pdf>; and "PowerPC 405 Processor Block Reference Guide" publication EDK 6.1 [online], Xilinx Inc., 2003, [retrieved on 2004-12-16], retrieved from the Internet <http://direct.xilinx.com/bvdocs/userguides/ppc_ref_guide.pdf>.

Figure 2:
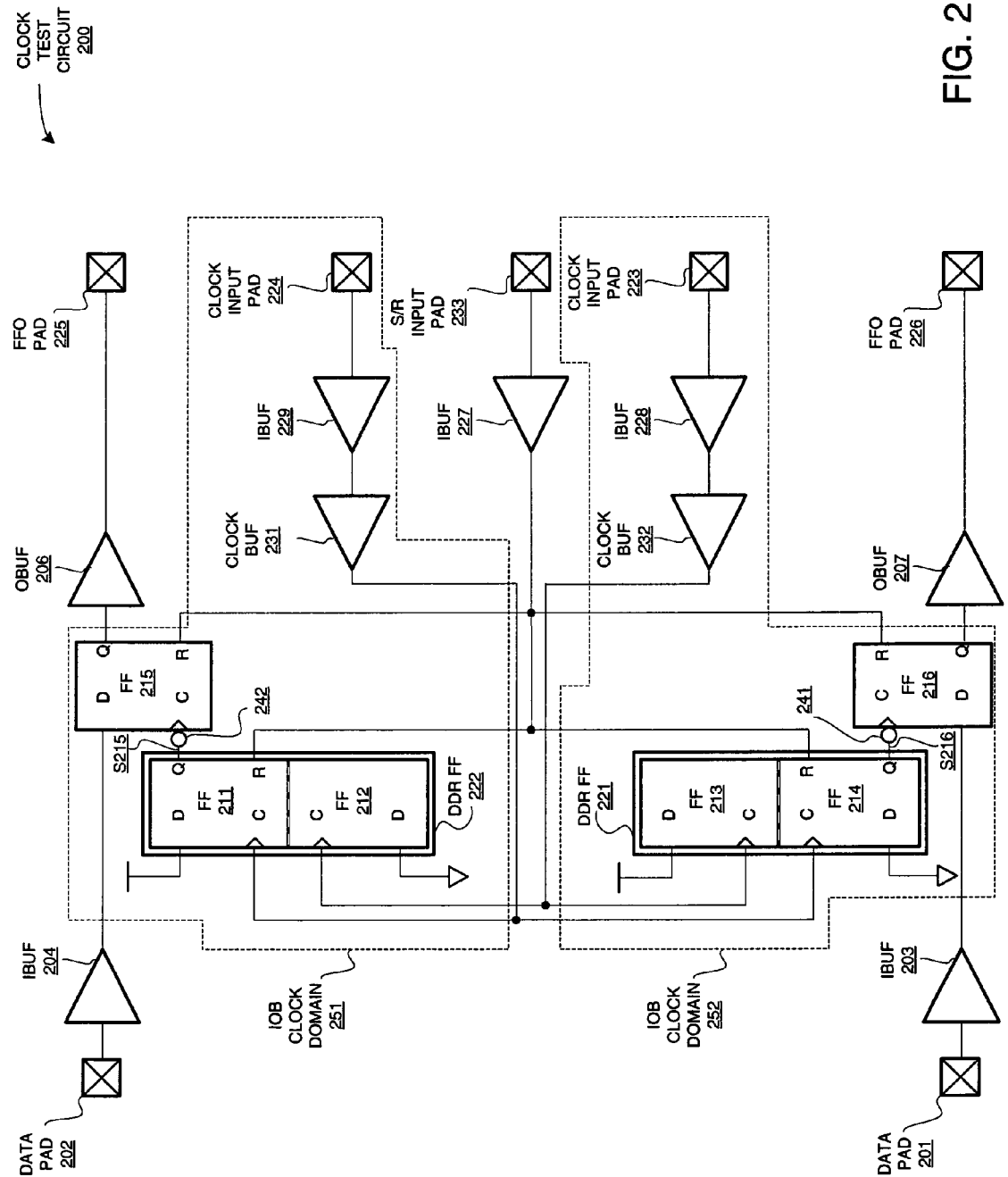
FIG. 2 is a logic diagram depicting an exemplary embodiment of a clock test circuit.

FIG. 2 is a logic diagram depicting an exemplary embodiment of a clock test circuit 200. Clock test circuit 200 may be implemented in FPGA 100 of FIG. 1. Clock test circuit 200 is for determining whether two or more independent clock edges issued by an integrated circuit ("IC") tester are coincident.

FIG. 3 is a high-level block diagram depicting an exemplary embodiment of an IC tester 300 coupled to FPGA 100. FPGA 100 includes a programmably configured-in clock test circuit 200. This may be done in part by programmably configuring IOBs and clock networks of FPGA 100. IC tester 300 may be coupled at least to clock input pad 223 and 224 of clock capable IOBs for providing two separate clock signals to clock test circuit 200. By cross-clocking a pair of double data rate ("DDR") flip-flops ("FFs") 221 and 222 of FIG. 2 by respective input to clock input pads 223 and 224, a signature, which may be captured downstream by a synchronous element, may indicate whether one edge arrived earlier or later than another edge of clock signals 331 and 332 respectively input from IC tester 300 to clock input pads 223 and 224, or if such edges were coincident in time.

With simultaneous reference to FIGS. 2 and 3, clock test circuit 200 is further described. For purposes of clarity, it is assumed that clock networks, such as clock buffers ("CLOCKBUFs") 231 and 232, as well as input buffers ("IBUFs") 229 and 228 and DDR flip-flops 221 and 222, have identical or near identical timing characteristics such that by observing a time-resolved output of flip-flops 215 and 216, it may be determined whether edges of clock signals 331 and 332 respectively input to clock input pads 223 and 224 are coincident or whether one edge leads or lags the other edge. However, it should be understood that there may be some differences in propagation delay of such separate clock paths.

It should be appreciated that clock test circuit 200 is applicable to errors of clock input to pads 223 and 224. This is because clock paths associated with pairs of clock inputs may be matched using dedicated routing on a global clock network of FPGA 100 of FIG. 1. Thus, each clock pad, such as clock input pads 223 and 224, receives a signal, where each such clock signal is used to drive either a rising or a falling edge of a DDR flip-flop, such as DDR flip-flops 221 and 222. Notably, each clock signal input is employed to drive a portion of such DDR flip-flops in an IOB clock domain associated with the other clock input of the pair of clock inputs. Again, these clock networks may be matched such that when they traverse the same distance and location, accuracy is facilitated.

To determine leading, lagging, or coinciding of edges of clock signals provided by a tester, sequential elements, such as a pair of DDR flip-flops 221 and 222, are used, where such sequential elements are positioned in clock domains of two separate IOBs, namely IOB clock domains 251 and 252. An input clock signal 331 is provided to clock input pad 223 for input to input buffer 228, the output of which is provided to clock buffer 232. Clock buffer 232 is used to represent a portion of a global clock network. Output of clock buffer 232 is provided to clock a portion of DDR flip-flop 221 in IOB clock domain 252 and to clock a portion of DDR flip-flop 222 in IOB clock domain 251. More particularly, the portion of DDR flip-flop 221 clocked by output of clock buffer 232 is flip-flop 213 having its data input tied to a logic high level, and the portion of DDR flip-flop 222 clocked by output of clock buffer 232 is flip-flop 212 having its data input tied to a logic low level.

In a like manner, clock signal input to clock input pad 224 is provided to input buffer 229, the output of which is provided to clock buffer 231. Again, clock buffer 231 is used to represent a portion of a global clock network. Output of clock buffer 231 is input to another portion of DDR flip-flops 221 and 222. More particularly, output of clock buffer 231 is used to clock flip-flop 211 of DDR flip-flop 222, where flip-flop 211 has its data input tied to a logic high level, and to clock flip-flop 214 of DDR flip-flop 221, where flip-flop 214 has its data input tied to a logic low level. Output of DDR flip-flops 221 and 222, namely output signals S216 and S215 respectively, are respectively inverted by inverters 241 and 242. The inverted versions of output signals S216 and S215 are respectively provided as clock inputs to flip-flop 216 and flip-flop 215. Flip-flops 215 and 216 are sequential elements which are clocked responsive to falling edge output from DDR flip-flops 222 and 221. Alternatively, rising edge triggered flip-flops may be used with appropriate changes to the logic structure driving the clock inputs of flip-flops 215 and 216.

User-specified inputs may be provided to data pads 201 and 202. These user-specified inputs are respectively input to input buffers ("IBUFs") 203 and 204. The output of input buffer 203 is provided to a data input of flip-flop 216, and the output of input buffer 204 is provided to a data input of flip-flop 215. Thus output signature of flip-flops 215 and 216 responsive to respective clocking from DDR flip-flop 222 and DDR flip-flop 221 may have a signature which is responsive to data input via data pads 202 and 201, respectively. Output of flip-flop 215 is provided to output buffer ("OBUF") 206, and the output of output buffer 206 is provided to flip-flop output ("FFO") pad 225. Output of flip-flop 216 is provided to output buffer 207, and the output of output buffer 207 is provided to flip-flop output pad 226.

Additionally, DDR flip-flop 221 and DDR flip-flop 222 may be coupled, such as via input buffer 227, to a set/reset ("S/R") input pad 233 to receive a set/reset signal thereto. Such reset signal may further be coupled to flip-flops 215 and 216 for resetting those flip-flops.

FIG. 4 is a high-level block diagram depicting an exemplary embodiment of an FPGA 100 having digital clock managers ("DCMs") 401 and 402 for clocking IOBs 400 and 410, respectively. IC tester provides clock signal 410 to each DCM 401 and 402. Notably, IC tester 300 of FIG. 3 may be used to check alignment of clock signal edges as previously described by coupling to pads 225 and 226 to such tester, which pads may be of other respective IOBs of FPGA 100. DCM 402 may be used to clock IOB 410 and, more particularly, to provide a non-phase shifting clock signal to clock input pad 224 of IOB 410 of clock test circuit 200. In contrast, DCM 401, configured in a phase-shifting mode, provides a phase-shifting signal to clock input pad 223 of IOB 400 of clock test circuit 200. In this configuration, clock input to clock input pad 223 may be swept across phase of clock input to clock input pad 224. Notably, the role of DCMs 401 and 402 in this embodiment may be reversed.

FIGS. 5A, 5B, and 5C are timing diagrams depicting respective exemplary timing embodiments of clock test circuit 200 of FIG. 2. Notably, hashed boxes 550 illustratively indicate uncertainty of state of outputs S225 (i.e., signal on FFO pad 225) and S226 (i.e., signal on FFO pad 226) prior to establishing a state such as by asserting and releasing a reset signal 233, as generally indicated by pulses 502, 512, and 522 respectively in FIGS. 5A, 5B, and 5C. With simultaneous reference to FIGS. 2, 5A, 5B, and 5C, examples of timing of clock test circuit 200 are further described. In each of the examples in FIGS. 5A, 5B, and 5C, clock input pads 223 and 224 are driven to a logic level one value, all flip-flops are initialized to a logic level zero value, and all such flip-flops are reset on assertion of a set/reset signal.

In FIG. 5A, edge 501 of clock input signal S223 (i.e., the signal on clock input pad 223) arrives after reset pulse 502 of set/reset signal S233 (i.e., the signal on S/R input pad 233). Edge 501 of clock input signal S223 arrives prior to edge 503 of clock input signal S224 (i.e., the signal on clock input pad 224). Accordingly, DDR flip-flop 221 supplies a pulse 504 of output signal S216 to flip-flop 216. Notably, a rising edge of pulse 504 is provided responsive to edge 501 and a falling edge of pulse 504 is provided responsive to edge 503. Furthermore, output signal S215 of DDR flip-flop 222 transitions from a logic low level to a logic high level responsive to edge 503 of clock input signal S224. If input to data input pad 201 is set at a logic high level, and flip-flop 216 is initialized to a logic low level, output of flip-flop 216 will change state to a logic high level responsive to a falling edge of pulse 504. Accordingly, as indicated in FIG. 5A, flip-flop output signal S226 output from flip-flop 216 transitions from a logic low level to a logic high level responsive to a falling edge of pulse 504 of output signal S216.

DDR flip-flop 222 may provide a logic low to a logic high transition which prevents flip-flop 215, owing to a locally inverted clock output from inverter 242 for clocking flip-flop 215, from passing through data input signal 202. In this embodiment, if flip-flop 215 is initialized to a logic low level, output of flip-flop 215, namely flip-flop output signal S225, will remain at a logic low level as indicated in FIG. 5A.

Referring to FIG. 5B, edge 510 of clock input signal S224 provided to clock input pad 224 arrives earlier than edge 513 of clock input signal S223 provided to clock input pad 223. In this example, edge 510 arrives after reset pulse 512 of reset signal S233. This timing embodiment of FIG. 5B is similar to the above-described timing embodiment of FIG. 5A, except that the order of receipt of edges of clock input signals is reversed. Thus, output signal S215 of DDR flip-flop 222 transitions from a logic low to a logic high level responsive to edge 510 of clock input signal S224 and transitions from a logic high level to a logic low level responsive to edge 513 of clock input signal S223 to provide pulse 514. Accordingly, DDR flip-flop 222 sends pulse 514 allowing output of flip-flop 215 to change state, whereas output of flip-flop 216 will not change state. Thus, as illustratively shown in FIG. 5B, output of DDR flip-flop 221, namely output signal S216 transitions from a logic low level to a logic high level responsive to edge 513 of clock input signal S223, and output of flip-flop 215, namely output signal S225, transitions from a logic low to a logic high level responsive to a falling edge of pulse 514 output from DDR flip-flop 222. Moreover, output signal S226 from flip-flop 216 stays at a logic low level.

Referring to FIG. 5C, a pulse 522 of set/reset signal S233 applied to set/reset input pad 233 is used to set or reset clock test circuit 200. After application of pulse 522, coincident edges 521 and 523 respectively of clock input signals S223 and S224 as applied to clock input pads 223 and 224, respectively, are received by clock test circuit 200. Notably, edges 521 and 523 need to be relatively within phase, subject to accuracy of clock test circuit 200, and thus need not be exactly phase-aligned. In this instance, outputs S215 and S216 respectively of DDR flip-flops 222 and 221 will not change state, as indicated by maintaining a logic low level as illustratively shown in FIG. 5C. As DDR flip-flops 221 and 222 do not change state, neither will flip-flops 216 and 215 change state, as illustrated in FIG. 5C with outputs S226 and S225 maintaining a logic low level after receipt of edges 521 and 523. Accordingly, it should be understood that the degree of resolution of these clock input signals will be dependent upon the degree of resolution of DDR flip-flops 221 and 222, for example.

With renewed reference to FIG. 2, it should be appreciated that phase relationship of separate clock signal edges provided to clock input pads 223 and 224 will be visible after output from flip-flops 215 and 216. Measurement of such phase relationship may be obtained from flip-flop output pads 225 and 226, respectively. If a clock signal edge on clock input pad 223 arrives later than a clock signal edge on clock input pad 224, then DDR flip-flop 222 applies a pulse to flip-flop 215. If data pad 202 is set to a logic high level, and flip-flop 215 is initialized to a logic zero, output of flip-flop 215 changes state to a logic level one on the falling edge of the pulse applied to it from DDR flip-flop 222. DDR flip-flop 221 provides a logic low to high transition to prevent flip-flop 216, owing to a locally inverted clock signal input thereto, from passing through input obtained from data pad 201. If flip-flop 216 is initialized to a logic zero, flip-flop 216 will have an output that will remain at a logic level zero.

If a clock signal edge on clock input pad 224 arrives later than a clock signal edge on clock input pad 223, DDR flip-flop 221 sends a pulse that allows output of flip-flop 216 to change state. In contrast, output of flip-flop 215 will not be allowed to change state. If both clock signal edges to clock input pads 223 and 224 arrive relatively in phase, namely if they are coincident, output of both DDR flip-flops 221 and 222 will remain at a logic low level, thereby causing outputs of flip-flops 216 and 215, respectively, to maintain their current state. Thus, resolution of a signature responsive to data pad input, such as input via data pad 201 or 202, is dependent upon which of DDR flip-flops, such as either DDR flip-flop 221 or DDR flip-flop 222, is active with respect to sending a pulse to the sequential element, such as either flip-flop 216 or flip-flop 215, respectively.

Notably, if it is determined that one of the clock edges arrives earlier than the other, and coincident clock edges is the target, then one of such clock edge inputs may be swept in time until the outputs of flip-flops 215 and 216 indicate they are relatively aligned in phase. For the configuration of clock test circuit 200, such edges would be relatively aligned in phase when output of flip-flops 215 and 216 do not change state. Accordingly, a phase-shifting device may be coupled to one of the clock paths associated with clock input pad 223 or 224. For an FPGA implementation, such a phase-shifting device may be a digital clock manager ("DCM") configured in, for example, a digital phase shift mode as illustratively shown in the block diagram of FIG. 4.

It should be appreciated that clock test circuit 200 may be used to determine on-chip delays with respect to global clock networks. Thus, FPGA products may be tested with tighter margins owing to increased accuracy facilitated by clock test circuit 200. Clock test circuit 200 may be implemented by providing external or internal clock signals to an integrated circuit, such as an FPGA. As mentioned above, DCMs may be coupled to clock test circuit 200 to sweep the relative phase of an edge as between two clock signal inputs; however, the incremental delay associated with such a DCM may affect overall accuracy of the combination of clock test circuit 200 and such a DCM. The accuracy limitation imposed by including a DCM in one path can be overcome by introducing another DCM in the other path, but the phase-shifting is performed only through one of such DCMs. In this configuration, with zero phase shift introduced by the DCMs, both paths may be initially phase matched.

The above description has been based on a pair of DDR flip-flops. However, it should be appreciated that the above description is not limited merely to use of DDR flip-flops but may be extended to other like configured sequential elements capable of resolving edge discrepancies. Moreover, clock networks may be swapped and measurements repeated to insure repeatability of results, as well as to provide an indication that clock networks are sufficiently closely matched with regard to signal propagation delay.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A clock test circuit in an integrated circuit, comprising:
   a first clock network coupled to receive a first clock signal;
   a second clock network coupled to receive a second clock signal;
   a first double-data rate flip-flop having first data ports, first clock ports, a first reset port, and a first output port, the first double-data rate flip-flop coupled to receive the first clock signal from the first clock network to one of the first clock ports and coupled to receive the second clock signal from the second clock network to another one of the first clock ports, the one of the first clock ports associated with a logic low input to one of the first data ports, the other one of the first clock ports associated with a logic high input to another one of the first data ports;
   a second double-data rate flip-flop having second data ports, second clock ports, a second reset port, and a second output port, the second double-data rate flip-flop coupled to receive the first clock signal from the first clock network to one of the second clock ports and coupled to receive the second clock signal from the second clock network to another one of the second clock ports, the one of the second clock ports associated with a logic high input to one of the second data ports, the other one of the second clock ports associated with a logic low input to another one of the second data ports;
   a first flip-flop coupled to receive a first output from the first double-data rate flip-flop; and
   a second flip-flop coupled to receive a second output from the second double-data rate flip-flop.

2. The clock test circuit according to claim 1, wherein the first flip-flop is coupled to receive a first data signature input, and wherein the second flip-flop is coupled to receive a second data signature input.

3. The clock test circuit according to claim 2, further comprising:
   a first clock pad coupled to the first clock network to receive the first clock signal externally provided with respect to the integrated circuit; and
   a second clock pad coupled to the second clock network to receive the second clock signal externally provided with respect to the integrated circuit.

4. The clock test circuit according to claim 3, wherein the first clock pad is part of a first input/output block and wherein the second clock pad is part of a second input/output block.

5. The clock test circuit according to claim 4, wherein the first input/output block and the second input/output block are part of a programmable logic device.

6. The clock test circuit according to claim 5, wherein the programmable logic device is a Field Programmable Gate Array.

7. The clock test circuit according to claim 2, further comprising:
   a first digital clock circuit coupled to the first clock network to provide the first clock signal internally with respect to the integrated circuit; and
   a second digital clock circuit coupled to the second clock network to provide the second clock signal internally with respect to the integrated circuit.

8. The clock test circuit according to claim 7, further comprising:
   a first clock pad coupled between the first digital clock circuit and the first clock network to receive the first clock signal provided from the first digital clock circuit; and
   a second clock pad coupled between the second digital clock circuit and the second clock network to receive the second clock signal provided from the second digital clock circuit.

9. The clock test circuit according to claim 8, wherein the first clock pad is part of a first input/output block, and wherein the second clock pad is part of a second input/output block.

10. The clock test circuit according to claim 9, wherein the first input/output block and the second input/output block are part of a programmable logic device.

11. The clock test circuit according to claim 10, wherein the programmable logic device is a Field Programmable Gate Array.

12. The clock test circuit according to claim 7, wherein the first digital clock circuit is configured in a phase-sweeping mode to sweep phase of the first clock signal, and wherein the second digital clock circuit is configured in a non-phase sweeping mode to provide a fixed phase for the second clock signal.

13. The clock test circuit according to claim 12, wherein the first digital clock circuit is a first digital clock manager of a programmable logic device, and wherein the second digital clock circuit is a second digital clock manager of the programmable logic device.

14. The clock test circuit according to claim 13, wherein the programmable logic device is a Field Programmable Gate Array.

15. A system for testing for coincidence of clock signals, comprising:
   an integrated circuit tester; and
   an integrated circuit coupled to the integrated circuit tester, the integrated circuit including a clock test circuit, the clock test circuit including:
   a first clock network coupled to receive a first clock signal;
   a second clock network coupled to receive a second clock signal;
   a first double-data rate flip-flop having first data ports, first clock ports, a first reset port, and a first output port, the first double-data rate flip-flop coupled to receive the first clock signal from the first clock network to one of the first clock ports and coupled to receive the second clock signal from the second clock network to another one of the first clock ports, the one of the first clock ports associated with a logic low input to one of the first data ports, the other one of the first clock ports associated with a logic high input to another one of the first data ports;

a second double-data rate flip-flop having second data ports, second clock ports, a second reset port, and a second output port, the second double-data rate flip-flop coupled to receive the first clock signal from the first clock network to one of the second clock ports and coupled to receive the second clock signal from the second clock network to another one of the second clock ports, the one of the second clock ports associated with a logic high input to one of the second data ports, the other one of the second clock ports associated with a logic low input to another one of the second data ports;

a first flip-flop coupled to receive a first output from the first double-data rate flip-flop; and a second flip-flop coupled to receive a second output from the second double-data rate flip-flop.

16. The system according to claim 15, wherein the integrated circuit tester is configured to provide the first clock signal and the second clock signal to the clock test circuit, and wherein the integrated circuit tester is configured to receive a first data signature and second data signature responsive to at least one rising edge of the first clock signal and the second clock signal.

17. A method for testing clock signals, comprising:
providing a first clock signal to an integrated circuit;
providing a second clock signal to the integrated circuit;
clocking a first sequential circuit responsive to the first clock signal and the second clock signal, the first clock signal for clocking logic high data input to the first sequential circuit, the second clock signal for clocking logic low data input to the first sequential circuit;
clocking a second sequential circuit responsive to the first clock signal and the second clock signal, the second clock signal for clocking logic high data input to the second sequential circuit, the first clock signal for clocking logic low data input to the second sequential circuit;
clocking a third sequential circuit responsive to a first output from the first sequential circuit;
clocking a fourth sequential circuit responsive to a second output from the second sequential circuit;
providing first signature data to the third sequential circuit;
providing second signature data to the fourth sequential circuit;
monitoring a third output from the third sequential circuit responsive to the first signature data and the first output;
monitoring a fourth output from the fourth sequential circuit responsive to the second signature data and the second output; and
determining whether the first clock signal and the second clock signal are phase aligned responsive to the third output and the fourth output.

18. The method according to claim 17, wherein the first clock signal and the second clock signal are provided from a tester coupled to the integrated circuit.

19. The method according to claim 17, wherein the first clock signal and the second clock signal are provided from respective digital clock circuits of the integrated circuit.

20. The method according to claim 19, wherein the first clock signal is phase swept with respect to the second clock signal.

* * * * *